June 19, 1962 R. B. BURDETT 3,039,177

MULTIPLANAR PRINTED CIRCUIT

Filed July 29, 1957

Inventor
RHODES B. BURDETT
By Percy P. Lantzy
Attorney

United States Patent Office 3,039,177 Patented June 19, 1962

3,039,177

MULTIPLANAR PRINTED CIRCUIT

Rhodes B. Burdett, Little Falls, N.J., assignor to International Telephone and Telegraph Corporation, Nutley, N.J., a corporation of Maryland Filed July 29, 1957, Ser. No. 674,845
1 Claim. (Cl. 29—155.5)

This invention refers to printed circuits and more particularly to multiplanar printed circuits.

Present techniques of making printed circuits are well known. These comprise stenciling or printing conductors on a base dielectric plate, chemical deposition of the conductor over a stenciled base plate whereby metallic conducting films are formed which can be built up by repeating the deposition process or by electroplating. There is also the etching process whereby a dielectric plate coated with a thin metallic film, as copper, has applied thereon an acid resistant material such as asphalt and is then immersed in an acid bath which etches away the exposed metal leaving the asphalt covered metal portions. When the asphalt is removed, the printed circuit on the dielectric base plate remains. These processes have to do with the production of printed circuits in one plane and are therefore limited to that particular condition.

It is an object of this invention to provide a method for producing a multiplanar printed circuit.

It is a further object to provide a simple and easily constructed modular electronic assembly within the frame of a multiplanar printed circuit.

It is another object to provide a printed circuit which has incorporated in the dielectric base reinforcing ribs to provide additional strength to the printed circuit, especially when used in such applications as guided missiles, and the like, where the extreme limits of shock and vibration are encountered.

A feature of this invention is a method of producing a printed circuit which comprises electroplating a printed circuit on one side of a temporary metal base, applying to the surface dielectric material which contains thermosetting plastic substance, applying heat and pressure to the assembled materials, and then removing the temporary metal base, leaving a printed circuit embedded in the dielectric material.

A further feature is the method of producing a preformed multiplanar printed circuit which consists in printing a printed circuit on one surface of a formable metal sheet, applying to that surface dielectric material containing thermosetting plastic substance, subjecting the assembled material to heat and pressure to form the assembled materials to the desired multiplanar shape, and then removing the formable metal sheet, leaving a printed circuit embedded in the dielectric material of multiplanar configuration.

Another feature of this invention is a modular electronic assembly which consists of a multiplanar printed circuit containing within its confines electronic components, such as resistors, capacitors, inductances, etc., the leads of which are soldered to the appropriate portions of the printed circuit and then filling the interior space of the multiplanar printed circuit with a potting compound to retain the electronic components in position and so minimize damage thereto from shock and vibration, and atmospheric conditions.

Another feature is the method of producing an exceptionally strong printed circuit which consists in electroplating a printed circuit on one surface of a temporary metal base, applying to that surface dielectric material containing thermosetting plastic substance, and forming the assembled materials under heat and pressure so that reinforcing ribs are included in the dielectric material on the side opposite the printed circuit, and then removing the temporary metal sheet, leaving the printed circuit embedded in the reinforced dielectric material.

Another feature is the method of producing printed circuitry on both sides of the same dielectric sheet which comprises electroplating printed circuits on one surface of two temporary metal base plates, placing dielectric material containing thermosetting plastic substances between the said two surfaces, subjecting the assembled materials to heat and pressure, and then removing the temporary metal bases, leaving printed circuitry on both sides of the same dielectric material.

The above-mentioned and other features and objects of this invention will become more apparent by reference to the following description taken in conjunction with the accompanying drawings, in which:

FIG. 1 is an isometric view of a multiplanar printed circuit of this invention;

FIGS. 2, 3, and 4 are cross-sectional views showing successive steps in the method of making the printed circuit;

Figures 1, 2, 3, 4, 5:
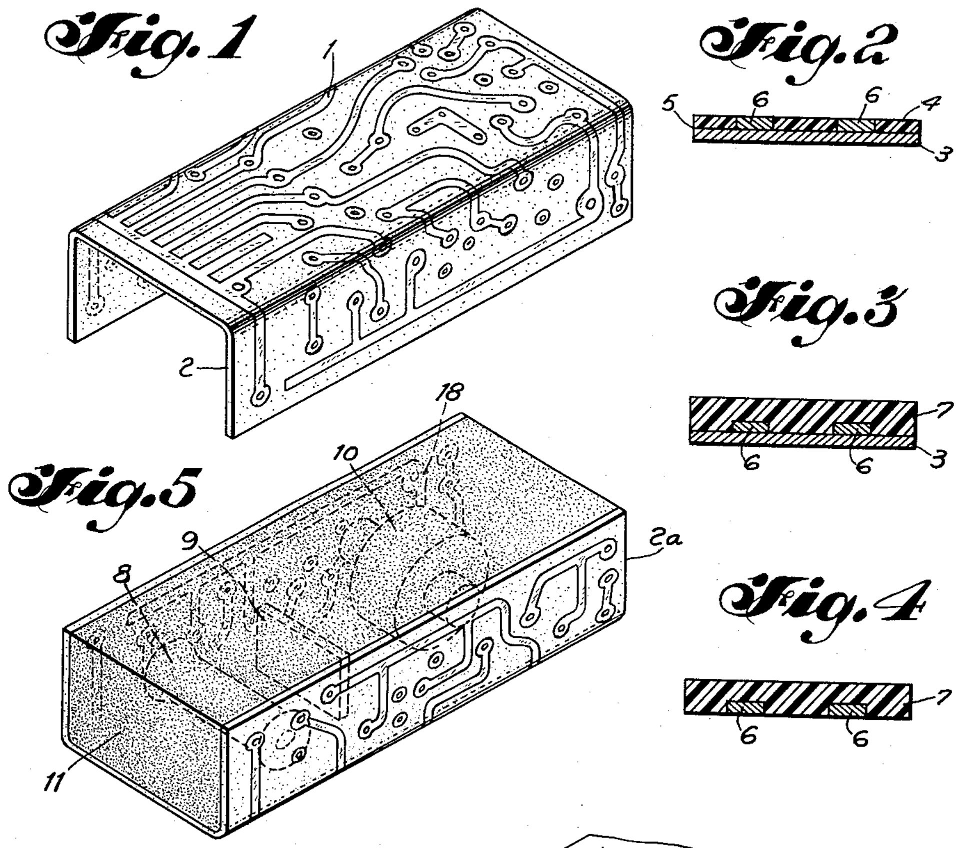
FIG. 5 is the multiplanar printed circuit of FIG. 1 with electronic components inside and held in position by potting compound.

Referring now to FIG. 1, there is shown a multiplanar printed circuit 1 in the form of a channel member 2 with the printed circuitry extending around all three sides of the channel member 2. The printed circuitry is flush with the outside surface of the channel member. The method of making the printed circuit 1 will become clearer by referring to FIGS. 2, 3, and 4, where a small portion of the printed circuit is shown in cross section. A flexible and formable copper sheet 3 is first covered with an acid resistant material 4, such as tar or asphalt, on surface 5, which may be applied in the usual manner, such as by silk screening, rubber stamping, or the like, leaving exposed those portions of the surface which are to form the areas of the printed circuitry. The asphalt coated copper sheet is then placed in an electroplating bath where another metal, in this case a noble metal, such as gold, silver, or rhodium, is electroplated on the exposed portions of the top surface 5 of the copper sheet 3. The acid resistant material 4 is then removed by means well known to those skilled in the art, leaving only copper base plate 3 and the printed circuitry 6. Insulating material having good dielectric properties, such as glass laminates, cloth laminates, or the like, and containing thermosetting plastic material, or having the thermosetting plastic material placed thereupon, is then positioned over the electroplated printed circuit, and heat and pressure are then applied to the assembly with the result as shown in FIG. 3. The insulating material 7 has been molded into one mass and the thermosetting material has filled all the spaces above the base plate 3. It is to be understood that the respective parts of the printed circuitry 6, base plate 3, and dielectric material 7 are not shown in exact proportion but are purposely exaggerated in size for purposes of illustration. After the molding process is finished, the molded part is placed in an acid bath which etches away the copper base plate 3, but does not affect the electroplated metal leaving the printed circuit 6 embedded in the dielectric 7 as shown in FIG. 4. The copper base plate is used for purpose of illustration, but it is to be understood that stainless steel or any other suitable metal can be used instead of copper and it then would be possible to electroplate copper, or other suitable metal on the base plate as well as gold, silver, or rhodium. However, where stainless steel is used as a temporary base plate, a different method of removing it is used. A nonsoluble oxide coating is formed over the surface on which the printed circuit is to be electroplated. The resist material and electroplating is done as before. After the molding process, it is sufficient to strip off the stainless steel base, because the adhesion of the electroplated metal to the stainless steel is much less than its affinity for the dielectric. It is also to be understood that instead of using a metal temporary base plate, a plastic plate with a metal coating on its surface can be used in the same manner, and where a flat single planar printed circuit is desired, the base plate does not have to have any flexibility or formability.

It is during the process of application of heat and pressure that the forming of the printed circuit takes place. In FIGS. 2, 3, and 4 the method of this invention has been applied to a single planar surface, but with the proper molds and a flexible base plate 3, the multiplanar form shown in FIG. 1, or any shape that can be molded in the usual manner can be adapted to this type of printed circuit manufacture. Any desired shape of printed circuitry can be obtained that is only limited by the molding process as known today.

A form of modular unit that is possible with this multiplanar printed circuit is shown in FIG. 5. Electronic components, such as a resistor 8, capacitor 9, and inductance 10 are placed in the space confined between walls of the channel 2*a*, which has printed circuitry 1*a* embedded in all its outer surfaces. These components are placed in position and then connected by means of their leads to the appropriate places in the printed circuitry 1*a* and soldered thereon. Then the remainder of the space is filled with a thermo plastic potting compound 11 so that the components are now firmly held in position and protected against shock, vibration, and atmospheric changes. Such a modular unit can be directly soldered to the electronic equipment for which it is designed, or a connector can be added to the unit so that it can be used as a plug-in unit and therefore can be easily replaceable.

Figure 6:
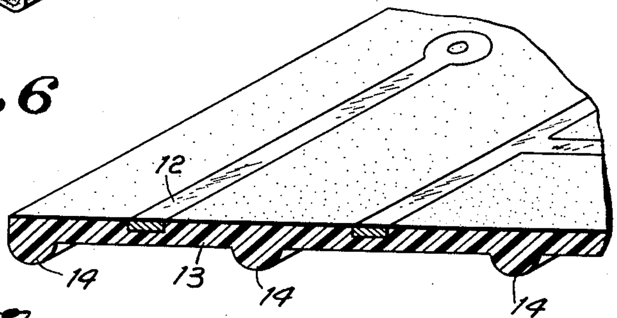
FIG. 6 is a cross-sectional view of a printed circuit showing reinforcing ribs.

In certain applications greater strength and rigidity are required in electronic equipment than ordinary conditions demand. In missiles and airplanes the requirements for shock and vibration resistance is much greater than for ground station equipment. A form of printed circuit utilizing the principles of this invention is shown in FIG. 6. The mold in which the assembly of temporary base plate (not shown), electroplated printed circuitry 12, and dielectric lamination 13 are placed, is designed to form ribs 14 running lengthwise of the dielectric material 13. There also may be designed other ribs running normal to the ribs 14 to add additional strength to the dielectric 13 if desired.

Figure 7:
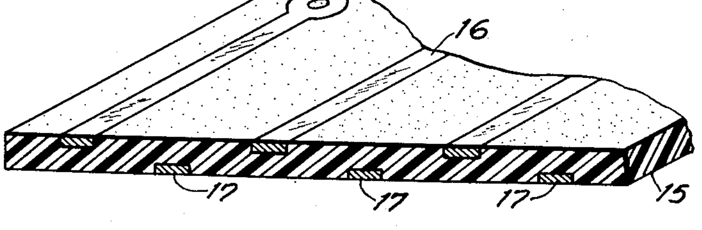
FIG. 7 is a cross-sectional view of printed circuits on both sides of the same dielectric supporting board.

FIG. 7 shows a two-sided printed circuit board wherein a dielectric plate 15 has embedded on both sides thereof printed circuitry 16 and 17 in accordance with the principles of this invention. This is adaptable for economy and space saving, as it eliminates the need for a second board and can also accommodate components on both sides of the same plate 15. This two-sided printed circuit method can be used also in the multiplanar form as is shown in FIG. 5, where the interior printed circuit 18 is partially shown.

While I have described above the principles of my invention in connection with specific apparatus, it is to be clearly understood that this description is made only by way of example and not as a limitation to the scope of my invention as set forth in the objects thereof and in the accompanying claim.

I claim:

The method of producing a preformed channel-shaped printed circuit which comprises forming a printed circuit on one surface of a flat formable temporary base, applying to said surface insulating materials containing thermosetting plastic substances, placing said base and thermosetting materials in a mold having the desired channel shape, applying heat and pressure to the assembled materials in said mold to simultaneously cause said thermosetting material to flow and embed said printed circuit and to form said assembly to the desired channel shape and thereafter removing said temporary base leaving said printed circuit embedded in the three walls of the channel shape of said insulating material.

References Cited in the file of this patent

UNITED STATES PATENTS

| | | |
|---|---|---|
| 1,892,146 | Harshberger | Dec. 27, 1932 |
| 1,900,595 | Weber | Mar. 7, 1933 |
| 2,431,393 | Franklin | Nov. 25, 1947 |
| 2,481,951 | Sabee | Sept, 13, 1949 |
| 2,498,807 | Hagenback | Feb. 28, 1950 |
| 2,565,611 | Kovach | Aug. 28, 1951 |
| 2,692,190 | Pritikin | Oct. 19, 1954 |
| 2,700,719 | Coler et al. | Jan. 25, 1955 |
| 2,724,674 | Pritikin | Nov. 22, 1955 |
| 2,786,969 | Blitz | Mar. 26, 1957 |
| 2,857,558 | Fiske | Oct. 21, 1958 |
| 2,880,378 | Lindseth | Mar. 31, 1959 |
| 2,881,364 | Demer | Apr. 7, 1959 |
| 2,885,524 | Eisler | May 5, 1959 |